United States Patent
Carney et al.

(10) Patent No.: US 9,559,744 B2
(45) Date of Patent: Jan. 31, 2017

(54) SYSTEM AND METHOD FOR TDD/TMA WITH HYBRID BYPASS SWITCH OF RECEIVING AMPLIFIER

(71) Applicants: Paul Carney, Middletown, CT (US); Jing Wang, Unionville, CT (US)

(72) Inventors: Paul Carney, Middletown, CT (US); Jing Wang, Unionville, CT (US)

(73) Assignee: Alcatel Lucent, Boulogne-Billancourt (FR)

( * ) Notice: Subject to any disclaimer, the term of this patent is extended or adjusted under 35 U.S.C. 154(b) by 563 days.

(21) Appl. No.: 13/633,441

(22) Filed: Oct. 2, 2012

(65) Prior Publication Data

US 2013/0072137 A1 Mar. 21, 2013

Related U.S. Application Data

(63) Continuation of application No. 12/536,184, filed on Aug. 5, 2009, now Pat. No. 8,295,212.

(51) Int. Cl.
| | |
|---|---|
| *H04J 3/00* | (2006.01) |
| *H03F 1/00* | (2006.01) |
| *H04B 1/401* | (2015.01) |
| *H03F 3/72* | (2006.01) |
| *H04B 1/52* | (2015.01) |

(52) U.S. Cl.
CPC ............. *H04B 1/401* (2013.01); *H03F 3/72* (2013.01); *H04B 1/52* (2013.01)

(58) Field of Classification Search
None
See application file for complete search history.

(56) References Cited

U.S. PATENT DOCUMENTS

| | | | |
|---|---|---|---|
| 4,492,960 A | 1/1985 | Hislop | |
| 5,606,283 A * | 2/1997 | Allen et al. | ............... 330/124 R |
| 6,591,086 B1 | 7/2003 | Pleasant | |
| 6,812,786 B2 * | 11/2004 | Jackson | .................... H03F 1/52 |
| | | | 330/124 D |
| 2007/0015468 A1* | 1/2007 | Kouki et al. | .................. 455/63.1 |
| 2009/0109085 A1* | 4/2009 | Needham et al. | ............ 342/174 |
| 2009/0256633 A1* | 10/2009 | Emdadi | ......................... 330/151 |

(Continued)

FOREIGN PATENT DOCUMENTS

| | | |
|---|---|---|
| WO | 2006/131595 A1 | 12/2006 |
| WO | 2008/103086 | 8/2008 |
| WO | 2008/135630 A1 | 11/2008 |

OTHER PUBLICATIONS

Written Opinion of the International Searching Authority for PCT/US2010/042833 dated Aug. 5, 2009 (Cited in parent case).

(Continued)

*Primary Examiner* — Jutai Kao
(74) *Attorney, Agent, or Firm* — Kramer & Amado, P.C.

(57) ABSTRACT

Various embodiments disclosed herein relate to a circuit for connecting a transceiver input/output to an antenna, the circuit including one or more of the following: a transceiver port; an antenna port; a reception path disposed between the transceiver port and the antenna port; a first amplifier configured to amplify a signal on the reception path when the circuit is configured according to a normal operation mode; and a first hybrid coupler configured to establish a bypass path around the first amplifier when the circuit is configured according to a bypass operation mode.

23 Claims, 5 Drawing Sheets

(56) References Cited

U.S. PATENT DOCUMENTS

2009/0285270 A1* 11/2009 Wong ........................ 375/219
2010/0026388 A1* 2/2010 Plotka ................. H03F 1/0277
  330/124 R

OTHER PUBLICATIONS

International Search Report and the Written Opinion of the International Searching Authority, or the Declaration dated Oct. 28, 2010.(Cited in parent case).

* cited by examiner

SYSTEM AND METHOD FOR TDD/TMA WITH HYBRID BYPASS SWITCH OF RECEIVING AMPLIFIER

CROSS-REFERENCE TO RELATED APPLICATIONS

This application is a continuation of application Ser. No. 12/536,184, filed on Aug. 5, 2009, the entirety of which is hereby incorporated herein by reference for all purposes.

TECHNICAL FIELD

Embodiments relate generally to time division duplex connections of radio frequency transmitters, receivers, related amplifiers, and antenna elements.

BACKGROUND

Wireless radio frequency (RF) communications may employ a time division sharing or multiplexing of a common antenna by RF transmitting units and RF receiving units. For purposes of this description, the term "antenna," standing alone, means at least major radiating element(s) of what may be a larger structure. Such time division sharing may be employed by, for example, the RF receiving and RF transmitting units forming the transceiver systems within a base station of a wireless communication system, e.g., a cellular telephone system. Because the sharing of a common antenna is between signals traveling in opposite sending and receiving directions, this may be referred to as Time Division Duplex (TDD) sharing.

To achieve a desirable coverage area, antenna are often positioned a considerable height above ground. The positioning may be accomplished by, for example, mounting the antenna on a tower. In such a mounting arrangement, the RF receiving unit may not be positioned proximal to the antenna feed. Instead, it may be located at a distance away that is at least equal to the height of the antenna. However, as known in the RF communication arts, propagating an un-amplified reception signal from an antenna feed to a receiver located a significant distance away may results in a signal, when arriving at the receiver, having substantially lower signal-to-noise ratio (SNR) that exhibited at the feed. To avoid such degradation, an RF amplifier may be arranged between the feed port of the antenna and the input of the RF receiving unit, configured to amplify the RF signal received from the antenna feed port into a higher power signal, thereby reducing the degradation in signal-to-noise ratio (SNR) caused by additive noise. Typically, for reasons well known to persons skilled in the relevant arts, the RF amplifier that amplifies the RF signal received from the antenna feed port for transmission to the RF receiving unit is a low noise amplifier (LNA).

The receiving RF LNA, however, often imposes a requirement that signal energy from the RF transmitter does not couple onto input of the RF LNA during operation of the RF receiver unit. Such energy would be amplified by the RF amplifier and then input to the RF receiver unit.

One known arrangement for reducing RF transmitter energy coupling into the receiving RF LNA input is a switching circuit that alternately connects the output of the transmitting unit and the input of the RF LNA amplifier to the feed terminal of the antenna. For brevity and consistency, this prior art switching arrangement will be arbitrarily labeled as a "switch-based TDD RF LNA isolator."

Prior Art FIG. 1 shows an exemplar of a switch-based TDD RF LNA isolator, connecting between a base station transceiver (BST) port 10 and an antenna feed port 16. The feed to the BST port 10 is not shown. For example, BST port 10 may connect to the input (not shown) of a receiver unit (not shown) and to the output (no shown) of a transmitter unit (not shown). In the transmit mode the switches 20 and 24 isolate the RF amplifier 18 and connect the BST port 10 to the antenna port 16. In contrast, in the receive mode, the switches 20 and 24 isolate the BST port 12 from the antenna port 16, while providing a path for incoming RF communication signals from the antenna feed port 16 to the input 18A of the RF amplifier 18, and a path from the output 18B of the RF amplifier 18 to the BST port 10.

Another known apparatus and method for isolating signal output of the RF transmitter from the input of the RF receiving amplifier employs a particular arrangement of circulators. The operation of circulators is known to persons skilled in the related arts and, therefore, a detailed description is omitted here. Prior Art FIG. 2 illustrates an exemplar of a known circulator-based TDD RF LNA isolating apparatus. Referring to FIG. 2, the illustrated exemplar has a first circulator 12 fed at one port (12A) by the BST port 10, and a second circulator 14 having a port 14A receiving, through transmission path 15, output from port 12B of the first circulator 12. As seen by the relative position of ports 12B and 12A of the first circulator 12 along the circulator coupling direction 12R, signals entering port 12A couple to port 12B. Likewise, as shown by their relative position along the second circulator coupling direction 14R, signals entering port 14A couple to port 14B. Port 14B of the second circulator 14 connects to the antenna feed port 14.

Referring to prior art FIG. 2, it is readily seen that the circulators 12 and 14 form a directionally coupled transmit path for RF transmitter signals exiting the BST port 10 to reach the antenna feed port 16, and form a directionally coupled reception path for reception signals to propagate from the antenna feed port 14A to the input 18A of the RF LNA 18, and from the output 18B of the RF LNA 18 to the BST port 10. More specifically, with respect to the transmit path, a transmitter signal enters port 12A of the first circulator 12, leaves port 12B, propagates along path 15, enters port 14A of the second circulator 14, leaves port 14B and, finally, enters the antenna feed port 16.

With continuing reference to the prior art FIG. 2, as seen the selective coupling characteristic of the second circulator 14 substantially reduces transmitter signal entering port 14A from coupling or otherwise leaking to port 14C. This is significant, because such transmitter signal would otherwise enter the input 18A of the RF LNA 18 and, hence, be amplified along with desired reception signal.

The above prior art methods apparatuses for TDD have various shortcomings. A significant shortcoming that is common to both these depicted switch-based and circulator-based TDD RF LNA isolators is that no failure-mode bypass of the RF LNA is provided. Methods for providing such bypass have been proposed and described, but each has various shortcomings and/or lacks features, benefits and advantages provided by exemplary embodiments and aspects according to the present invention. One illustrative example is the apparatus and method recited and illustrated at U.S. Pat. No. 6,812,786, issued 2004 to Jackson, et al. (hereinafter referenced as "Jackson '786"). Jackson '786 controls a selector switch 192 and controls two PIN diodes connecting to one hybrid 156, to selectively switch from the RF amplifiers 152 and 154 to the isolator 190. The selector switch 192 and its control are required, and as well as the isolator 190.

For these and other reasons the present embodiments provide advancements in the art, having various described features, advantages, and benefits as well as others that will be apparent to persons of ordinary skill in the art upon reading this disclosure.

SUMMARY

Various embodiments provide, among other features and benefits, a failure-mode bypass of the RF LNA without increase in noise figure (NF), with high switching speed, and without substantial increase in power dissipation, i.e., heat.

Various embodiments further provide, among other features and benefits, a minimal component count because of one or more aspects employing single components performing multiple substantial functions and, further, commonly structured components performing different functions, thereby providing performance benefits while, at the same time, reducing function-specific structure.

Applications of the various embodiments contemplate systems using RF amplifiers having a wide range of technologies and performance specifications and, therefore, for purposes of this description the term "RF amplifier" is defined as encompassing, but not being limited to, low noise amplifiers (LNA).

According to one exemplary embodiment, a system may have a TDD circuit for connecting a transceiver input/output (I/O) to an antenna, the circuit having a first hybrid coupler, having a first port connected or coupled to the antenna by, for example, a first path segment, and having a second hybrid coupler having a port connected, or coupled to the transceiver I/O by, for example, a second path segment. According to one or more aspects, a TDD circuit may have a first RF amplifier with an input connected by a first switchable impedance connector to a second port of the first hybrid coupler, and having an output connected by a second switchable impedance connector to a first port of the second hybrid coupler and, likewise, may have a second RF amplifier with an input connected by a third switchable impedance connector to the third port of the first hybrid coupler, and having an output connected by a fourth switchable impedance connector to a third port of the second hybrid coupler. A TDD circuit according to one or more aspects may further include a third hybrid coupler, having a first port connected to a fourth port of the second hybrid coupler, and having a second port connected to the fourth port of the first hybrid connector, a third port terminated by a first switchable impedance termination device, and a fourth port terminated by a second switchable impedance termination device. According to one or more aspects, each of the switchable impedance connectors, and each of the switchable impedance termination devices is configured to switch its impedance between a given matching impedance and a given mismatching impedance, in response to a given condition.

As will be understood, according to various aspects of one or more embodiments, a first hybrid coupler, a second hybrid coupler and third hybrid coupler may be arranged and configured to provide, in response to a concurrence of their switchable impedance connectors and a switchable impedance terminations having the mismatching impedance—resulting from an event such as, for example, a power supply failure—a bypass rearward directional path from the first port of the first hybrid coupler to the first port of the second hybrid device, the bypass rearward directional path bypassing the first and second RF amplifiers.

The above-summarized various illustrative examples of advances and advantages of the exemplary embodiments should not be understood as an exhaustive list or as a limit of the possible advantages that may be realized. On the contrary, various other advantages, as well as various alternative embodiments that are within the scope of the appended claims will be apparent to persons of ordinary skill in the art upon reading this disclosure.

DETAILED DESCRIPTION

Figure 1:
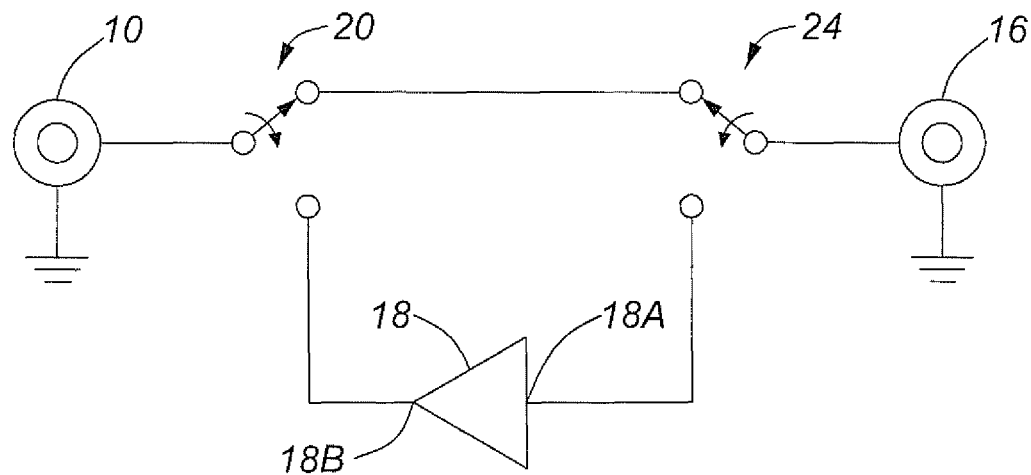
FIG. 1 shows an exemplar according to a prior art switch-based TDD RF LNA isolation scheme.
Figure 2:
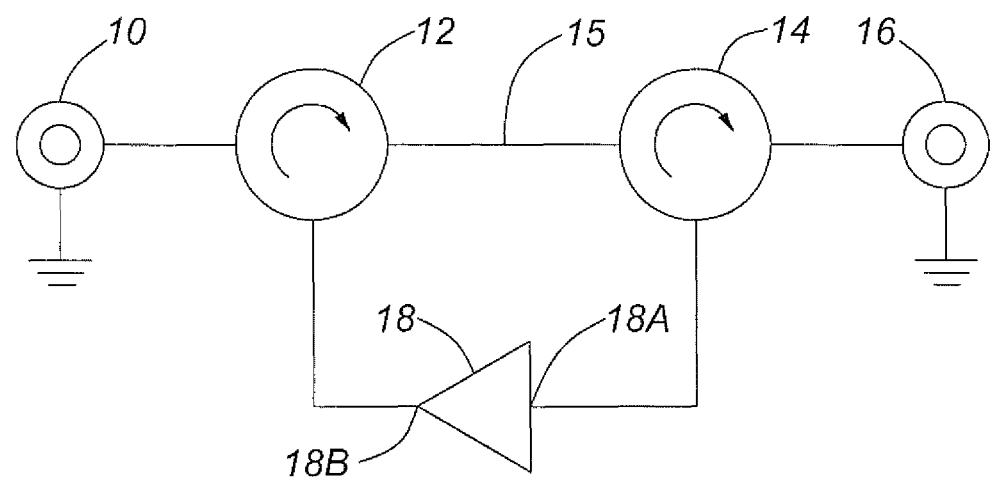
FIG. 2 shows an exemplar according to a prior art circulator-based TDD RF LNA isolation scheme.

Various exemplary embodiments are described in reference to specific illustrative examples. The examples are included to further assist a person of ordinary skill in the art form a clear understanding of, and to practice the invention. The scope of embodiments, however, is not limited to the specific illustrative examples that are presented. Instead, as will be readily recognized by persons of ordinary skill in the relevant arts based on this description, many other configurations and arrangements may be implemented.

As will be appreciated by persons of ordinary skill in the art, for clarity of illustration figures may not be drawn to scale. For example, certain depictions may have distortion of shape and/or exaggeration of relative proportions, for purposes of a clear depiction of a whole.

To avoid obscuring novel features and aspects, and as will be readily understood by persons of ordinary skill in the art upon reading this description, various details of algorithms and hardware that are well known to such persons are omitted, except where such details pertain to particular operations of the features and aspects.

Example embodiments and aspects may be described separately, or as having certain differences. Separate description or description of differences, however, does not necessarily mean the respective embodiments or aspects are mutually exclusive. For example, a particular feature, function, or characteristic described in relation to one embodiment may be included in, or adapted for other embodiments.

In one example system according to one embodiment, a forward transmission path may be implemented by a first circulator located, for example, near the transmitter output, a first port of the first circulator receiving the forward signal and directionally coupling it to a second port, and two similarly coupled ports of a second circulator. The second circulator may be located, for example, near a feed port of the antenna. A forward transmission segment connects the second port of the first circulator to the first port of the second circulator, that port being directionally coupled to the second port of the second circulator.

In one example according to this and other embodiments, a receiving propagation path is provided from the antenna, in a rearward direction back to the RF receiving unit(s) of the transceiver. According to one aspect, the receiving propagation path includes one or more receiving RF amplifier coupler-bypass embodiments that, in overview, provide a novel switchable connection of one or more RF amplifier(s) in the receiving propagation path segment with, for example, two operating modes—a normal mode and a bypass mode.

According to one aspect, an RF amplifier coupler-bypass embodiment includes one or more RF multiport couplers, having switchable impedances connected to one or more of the coupler's ports. The ports are hereinafter referenced as "I/O" ports because, unless otherwise stated, the multiport couplers are symmetric.

In one or more aspects of the RF amplifier coupler-bypass embodiments, the switchable impedances have two impedance states, one of the states referenced herein as a given matching impedance, the other referenced as a given mismatching impedance. As will be understood by persons of ordinary skill in the art upon reading this disclosure, the terms "matching" and "mismatching" are in reference to the given impedance of the multiport RF couplers. Further to this aspect of the RF amplifier coupler-bypass embodiments, the RF multiport couplers are structured to provide a normal coupling mode in response to the impedance state of the connected switchable impedances being one of the matching and mismatching states, and to provide a bypass coupling in response to these switchable impedances being the other of matching and mismatching.

To facilitate a ready understanding of the various aspects and embodiments, example implementations are described wherein the RF multiport couplers are configured to provide the normal coupling mode in response to the matching impedance state, and to provide the bypass mode in response to the mismatching impedance state. However, this is only an example for purposes of illustration, and alternate implementations may be identified by persons of ordinary skill in the art.

According to one aspect of one or more RF amplifier coupler-bypass embodiments using RF multiport couplers with switchable impedances connected to one or more of the couplers' I/O ports, the couplers are arranged to provide, in response to switching the impedances between the matching state and the mismatching state, a corresponding changing between a normal mode RF amplifier path—in which the RF amplifier(s) is(are) in line with the receiving propagation path—and a bypass mode RF amplifier path—in which the receiving propagation path bypasses the RF amplifier(s).

According to one or more aspects of at least one RF amplifier coupler-bypass embodiment using switchable impedances, the switchable impedances may receive a system power and, in response to the system power changing between a given acceptable level and a given failure level, may switch between the matching and the mismatching states. This system power may be common with a system power provided to the RF amplifier(s). Therefore, as will also be understood, among the various benefits and features of this aspect of the RF amplifier coupler-bypass embodiments is that, upon a failure of the system power that causes failure of the RF amplifiers, the switchable impedance switches, since the power failure causes these to switch their impedance state to the mismatching state which, in turn, causes the RF multiport couplers to provide the bypass path, the RF amplifier(s) are automatically bypassed in the event of a system power failure.

According to one aspect of one or more embodiments, the RF amplifier coupler-bypass circuit may include a transmit interval RF amplifier isolation aspect, operational during the normal mode (i.e., when power is available to the RF amplifiers) that, during transmit intervals, (meaning intervals in which the transmitter of the transceiver unit is transmitting signals to the antenna feed port) effectively isolates the RF receiver amplifiers from the antenna feed port. As will be understood from the detailed description, among other advantages and benefits, this provides a substantial reduction of the RF amplifiers, whose intended function is amplifying signals received from the antenna feed, from receiving transmitted signal energy during the transmit interval, (such as from imperfect circulators) and then amplifying such signals, and then inputting the amplified signal to the receiver of the transceiver unit.

For purposes of consistent referencing, this RF amplifier isolation aspect will be referenced hereinafter as "transmit interval RF amplifier isolation."

According to one aspect of one transmit interval RF amplifier isolation embodiment, a transmitted signal power detection circuitry detects signal power generated by the transmitter of the transceiver unit, and generates a corresponding transmitter power detection signal. The transmitter power detection signal may be referenced as, for example, a TX/RX control signal. Further to the one aspect, isolation switches are controlled by the TX/RX control signal such that, in the absence of transmitter power, the RF amplifiers are switched into the return path from the antenna feed to the transceiver port (and thus to the RF receiver of the transceiver unit) and, in the presence of transmitter power, the RF amplifiers are switched out of the return path from the antenna feed to the transceiver port.

According to one example having one or aspect of RF amplifier coupler-bypass embodiments, the RF multiport couplers may comprise what will be termed "dual-mode" 90-degree hybrid couplers" each having an associated switchable impedance to switch from a normal coupling mode to a bypass coupling mode. According to one example, a dual-mode 90-degree hybrid coupler may comprise a conventional 90-degree hybrid coupler having a first I/O port, a second I/O port, a third I/O port and a fourth I/O port, with the first I/O port being the designated input port, and having a first switchable impedance connected to the third I/O port and a second switchable impedance connected to the fourth IO port. In one example, the dual-mode 90-degree hybrid coupler may be implemented by a 90-degree hybrid coupler structured and configured to provide a "normal mode" coupling from the first I/O port to the third and fourth I/O ports when the first and second switchable impedances have the matching impedance state and, in contrast, to provide a "bypass mode" coupling from the first I/O port to the second I/O port when the first and second switchable impedances have the mismatching impedance state.

According to one or more aspects of various RF amplifier coupler-bypass embodiments, an RF amplifier coupler-bypass circuit may be arranged in the reception propagation path, the circuit having a plurality of dual-mode hybrid phase shift couplers, arranged with one or more RF receiving amplifiers. In one example arrangement having one or embodiments, in response to a "normal mode" condition, a first of the dual-mode 90-degree hybrid couplers provides a propagation path to the input(s) of the RF receiving amplifier(s), and a second of the dual-mode 90-degree hybrid couplers provides a propagation path from the output(s) of the RF receiving amplifier(s) to the feed or connection port of the RF transceiver. In example aspects having a circulator near the connection or feed of the transceiver, this propagation path includes respective ports of that circulator.

Further, according to various aspects of one or more exemplary embodiments, the above-described RF amplifier coupler-bypass circuit may be configured and arranged with a third of the dual-mode 90-degree hybrid couplers to provide, in response to a "bypass mode" condition, a bypass path around the RF receiving amplifiers, through these first, second and third dual-mode 90-degree hybrid couplers. As will be described in greater detail in later sections, in the event of, for example, a power failure that disables the RF receiving amplifier proximal to the antenna, this aspect automatically provides, despite the power failure, the RF reception signal to propagation to the RC receiver unit(s) within the system transceiver.

In one example having the transmit interval RF amplifier isolation aspect, an attenuation path may be arranged in parallel with each of the RF receiver amplifiers with, for example, an arrangement of 1:2 or 2:1 single-pole-double-throw (SPDT) switches arranged to switch according to the TX/RX control signal such that, in response to detected transmitted signal power, the RF amplifiers are switched out of the return path from the antenna feed to the transceiver port and the attenuators are connected in their place.

According to one or more of the isolation aspects, the 1:2 and 2:1 SPDT switches for switching between the RF receiver amplifiers and the attenuators may be constructed and arranged to additionally provide the switchable impedance function. In other words, according to the these aspects, in the 1:2 and 2:1 SPDT switches' normal mode of operation, e.g., when the switches receive adequate power, in addition to their performing their respective receive and transmit mode switching, each switch also provides a matching impedance at the I/O port of dual-mode 90-degree hybrid couplers, such that the couplers operate in their normal mode.

As will be understood, among the various features and benefits of one transmit interval RF amplifier isolation aspect is that no external control signal is needed to control the isolation switches. On the contrary, the transmitted signal power detection circuitry simply detects when a transmitter of the transceiver unit is transmitting signal power to the antenna, generates the TX/RX or equivalent transmitter power detection signal and, in response, the isolation switches remove the RF amplifiers from return path from the antenna feed to the transceiver unit port. Among other features and benefits provided by this aspect is an asynchronous sharing of the antenna by one or more transmitters within the transceiver unit One among the example benefit according to one aspect is a hardware savings, as 90 degree hybrid couplers implementing the isolation aspect may be common with hybrid couplers bypassing the RF receiver amplifiers in the event of, for example, a power failure.

According to one or more of the various embodiments having the above-described first and second circulators, the forward transmission path may include a receiving interval transmission isolation According to various aspects, receiving interval transmission isolation enable the forward transmission path during a transmission interval (i.e., when the transmitter power detection signal or TX/RX control signal indicates signals are being transmitted), and disable the forward transmission path outside of the transmission interval. In the TX mode the isolation circuit provides a low loss path of less than 0.5 dB. In the RX mode it attenuates the path by 12 to 18 dB Further, according to various exemplary embodiments the receiving interval transmission isolation includes a normal/bypass aspect that disables the isolation in the event of a failure condition such as, for example, the above-described failure to receive a normal power at the RF receive amplifier (and at the switchable impedances within the RF amplifier coupler-bypass circuit). According to one or more aspects, the isolation and the disabling of the isolation may be implemented by, for example, a dual-mode 90-degree hybrid coupler having switchable impedances connected to two of its designated I/O ports.

Figure 3:
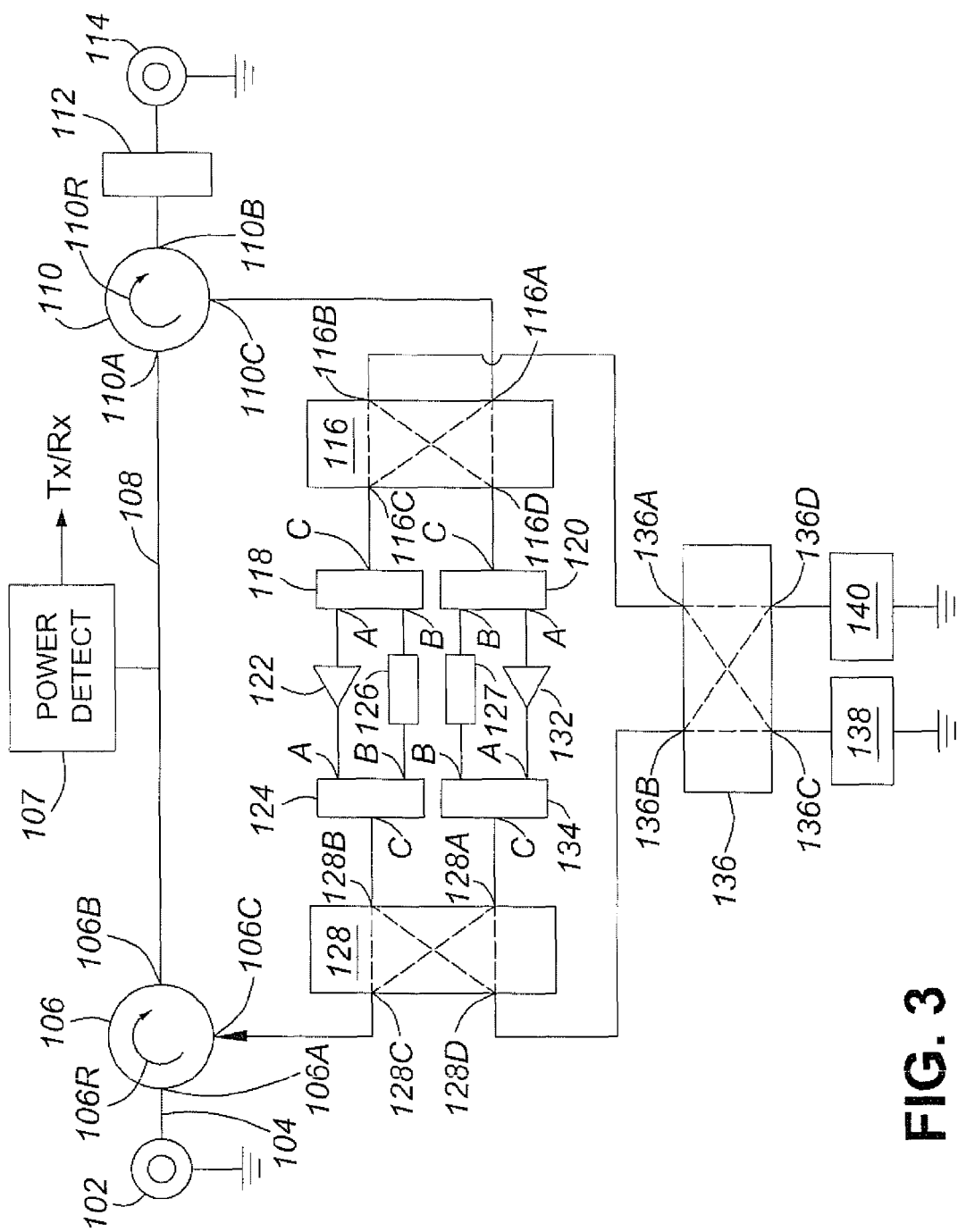
FIG. 3 depicts one illustrative example according to one TDD RF amplifier hybrid switch bypass of one or more embodiments.

FIG. 3 illustrates one example TDD Hybrid Bypass system 100 having various aspects of one or more of the exemplary embodiments. It will be understood that the system 100 is depicted as functional blocks, each block representing circuit transfer functions, connected by lines representing signal paths. Unless otherwise stated, or made otherwise clear from the particular context, the technology and performance specifications of signal paths connecting functional block are not particular to the invention, and may implemented using conventional design methods and conventional technology, based on selection criteria ordinarily applied by persons of ordinary skill in the arts pertaining to the invention. It will also be understood that signal paths represented by the interconnecting lines on FIG. 3 are not necessarily implemented as simple transmission paths and may, for example, include devices such as limiters, amplifiers and filters, in accordance with convention design and performance considerations.

Referring now to FIG. 3, the example system 100 includes a BTS port 102 that may, for example, feed an output of a transmitter (not shown) and an input of a receiver (not shown). The BTS port 102 connects via a transmission path 104 to an "A" port 106A of a first circulator 106. The example first circulator 106 has a second signal port 106B and a third port 106C. It will be understood that the port labels of "A," "B," and "C" are arbitrary. The principles of operation, available structures, and circuit considerations for using circulators are known to persons of ordinary skill in the art and, therefore, except for purposes of describing their interface within the example systems described herein, further detailed description is omitted. Further, persons of ordinary skill in the art, upon reading the present disclosure in its entirety, can readily specify performance criteria the circulator must meet, by applying conventional RF design considerations to the particular system specifications and its the particular application.

With continuing reference to FIG. 3, the directed arrow 106R represents the coupling characteristic of the first circulator 106. As shown, transmission signals that enter I/O port 106 will, through a directional coupling mechanism forming, from port A and port B, a forward transmission path as known to persons of ordinary skill in the art, exit port 106B. A forward transmission path 108 connects port 106B of the first circulator 106 to port 110A of a second circulator 110. The FIG. 3 example 100 shows the example forward transmission path 108 as a simple transmission path, with no switching structure. The depicted path 108 is, as will described in greater detail in later sections and in reference to later figures, other aspects of these and other exemplary embodiments may include one or more directional couplers (not shown in FIG. 3) and, further, may include a receiving interval transmission isolation aspect (not shown in FIG. 3) that, for example, isolates the LNA signals from being fed back upon itself through the TX path during the receiving interval.

Referring to FIG. 3, I/O port 110B of the second circulator 110 may connect, in the depicted example 100, through a bandpass filter 112 to an antenna feed port 114. Specifications of the bandpass filter 112 and the technologies for its implementation, as well as the factors and considerations for including or omitting such a filter may be according to conventional transceiver design, and are readily identifiable to persons of ordinary skill in the art based on this description. Further detailed description of the bandpass filter 112 is therefore unnecessary for understanding and practicing the embodiments and, thus, is omitted.

With continuing reference to FIG. 3, port 110C of the second circulator 110 connects through a path (not separately labeled) to input 116A of multiport coupler 116. The example arrangement of the multiport coupler 116, together with the multrport couplers 128 and 136, and their associated example circuitry provide, among other functions and features, a "normal" mode, and a "bypass" mode of operation. As will be understood, in the normal mode the RF amplifiers 122 and 132 are operational and, during the receiving time interval (i.e., the time interval when no transmitted signals are output from the BTS port 102 and the antenna is allocated to receiving signals) the RF amplifiers 122 and 132 are switched, by actions of the multiport couplers 116, 128 and 136 that are described in greater detail in later sections, to be within the path from the antenna feed port 114 back to the BTS port 102. In the bypass mode, on the other hand, such as may be occur, for example, in response to a power failure disabling the RF amplifiers 122, 132, later-described actions of the multi-port couplers 116, 128 and 136 and their supporting circuitry, provide a bypass path from the antenna feed port 114 back to the BTS port 102 that does not include the RF amplifiers 122, 132.

Referring still to FIG. 3, the example system 100 also includes one example implementation of a transmit interval RF amplifier isolation aspect as described previously. As described previously, and as will be described in greater detail in later sections, the FIG. 3 transmit interval RF amplifier isolation aspect includes a transmitted power detector 107 that detects transmitted signal power on the forward path 108 and based, for example, on a comparison to a given threshold, generates a corresponding transmit/receive mode control signal TX/RX. The TX/RX control signal may be received by switching circuitry, described in greater detail in later sections, that during the detected receiving interval (i.e., no communication signal output from the BTS port 102) maintains the RF amplifiers 122, 132 in the reception path from the antenna feed 114 to the BTS port 102 and, during the transmit interval, isolates the RF amplifiers 122, 132 from any path from the antenna feed 114 to the BTS port 102. As previously described, this isolation prevents the RF amplifiers 122, 132 from receiving coupled and/or radiated energy of the transmitted signal, amplifying it, and returning the amplified signal back to the BTS port 102.

With continuing reference to FIG. 3, in the depicted example 100, the transmit interval RF amplifier isolation aspect is provided by the switchable impedances 118, 120, 124 and 134 being configured to provide, in addition to the switchable impedance, the functions of a 1:2 or 2:1 SPDT switch. The example switchable impedances 118, 120, 124 and 134, because of including the 1:2 or 2:1 SPDT function, are therefore referenced hereinafter as "switchable impedance SPDT switches." It will be understood, though, that the "SPDT switch" feature is optional, as embodiments may omit the transmit interval RF amplifier isolation feature. As will be further described in later sections, in the example 100 a transmit-interval transmission isolation control such as, for example, the depicted power detector 107 may detect transmitter power in, for example, the transmission path 108 and, in response, may generate a control signal (not shown in FIG. 3) that is received by each of the switchable impedance SPDT switches 118, 120, 124 and 134. When the power detector 107 detects transmitter power in the transmission path 108, SPDT switches 118 and 120 switch to connect their respective "C" inputs to their respective B" outputs, and SPDT switches 124 and 134 switch to connect their respective "B" inputs to their respective "C" outputs. As a result, transmitter power leaking or coupling from transmission line 108, or from reflections from the antenna (not shown in FIG. 3) is substantially prevented from entering inputs (not separately numbered) of the RF amplifiers 122 and 132. Instead, such transmitter energy may dissipate in the attenuators 126, 130. To facilitate a ready understating of the embodiments, description of example aspects and operations of the multi-port couplers 116, 128 and 136 will first assume that the SPDT switches 118, 120, 124 and 134 are in their transmit isolation mode, i.e., that the system 100 is operating in a reception interval.

Referring to FIG. 3, in the particular arrangement depicted in the example 100, the multiport couplers 116, 128 and 136 will be assumed to be 90-degree hybrid couplers. This assumption does not, however, limit the practicing of various embodiments illustrated by the FIG. 3 example 100 to using a 90-degree hybrid coupler. On the contrary, other implementations of the embodiments and aspects contained in the example 100 may be apparent to persons of ordinary skill in the art, by a corresponding arrangement of other couplers. For purposes of readily describing example operations on the example 100, though, the example implementation of the multiport coupler 116 is a 90-degree hybrid coupler and, therefore, unit 116 will be referenced as a "90-degree hybrid coupler" 116.

Referring again to FIG. 3, example aspects and operations of each of the multiport couplers 116, 128 and 136 having two operative modes of coupling, one being the above-described "normal mode," and the other being the above-described "bypass" mode, and how these combine to provide the overall normal and bypass mode will be described. In one or more example embodiments, each of the 90-degree hybrid couplers 116, 128 and 136 has switchable impedances connected to at least two of its I/O ports. With respect to the 90-degree hybrid couplers 116, the switchable impedances are the SPDT switches 118 and 120 connected to its ports 116C and 116D. With respect to the 90-degree hybrid coupler 128, the switchable impedances are the SPDT switches 130 and 134 connected to its ports 128A and 128B. Lastly, with respect to the 90-degree hybrid coupler 138, the switchable impedances are the switchable impedances 138 and 140 connected, respectively, to ports 138C and 138D. Example implementations of the switchable impedances 138 and 140 are described in greater detail in later sections.

With continuing reference to FIG. 3, the SPDT switches 118 and 120 connected to ports 116C and 116D, switch the hybrid coupler 116 between its normal and bypass modes of operation by switching between two input impedance states; one matching (within a given tolerance) the given characteristic impedance of the 90-degree hybrid coupler 116, and the other state being a given mismatch relative to that given characteristic impedance. The term "input impedance," with respect to the example switches 118 and 120, means the impedance looking into their respective "c" input ports. The normal mode of coupling, resulting from the input impedances at the c inputs of 118 and 120 having their matching state, will be described first.

As a preliminary matter, as known to persons or ordinary skill in the art, any I/O port of a four-port 90-degree hybrid may be chosen as an "input," and, if matching impedances are connected to the remaining three ports, the hybrid exhibits the following coupling characteristic: The input signal is split within the coupler, in a power splitter manner, and two 3 dB attenuated versions of the signal are output from a respective two of the other four I/O ports. One of these two 3 dB attenuated signals has a given reference latency (which may be zero degrees), while the other of the two 3 dB attenuations of the signal has a 90-degree phase delay relative to the signal output from the first of the two "output" ports. Propagations of the input signal, however, cancel at the fourth I/O port.

In view of this coupling behavior of a 90-degree hybrid, and referring to example 100 of FIG. 3, when the switches 118 and 120 having the matching impedance at their respective inputs 118C and 120C, the hybrid coupler 116 acts as a power splitter, outputting, in response to a signal input at port 116A, a 3 dB attenuation of the input signal from port 116D and a 3 dB attenuation, with a 90-degree delay, from port 116C. To best provide a consistent terminology in this description, the terms "on-phase" and "quadrature" will be used to identify, in reference to the power splitter mode of the 90-degree hybrids, the 3 dB attenuated signal having a "zero" phase delay and the 3 dB attenuated signal having a 90-degree phase delay. The term "zero" is a relative term, as structural aspects of a 90-degree hybrid may introduce certain delay common to both the in-phase and quadrature signal paths.

Continuing with the above-describer illustrative "normal" operation of the 90-degree hybrids 116, i.e., with all of the above-described switchable impedance at their matching state, a reception signal from the antenna feed 114 passes through the BPF 112, into port 110B and out from port 110C of the second circulator 110. For purposes of reference, the reception signal will be arbitrarily labeled as RC(t). This RC(t) enters port 116A of the hybrid 116 and, as a result, a 3 dB attenuated in-phase RC(t) exits port 116D and, assuming switch 120 is in the receiving mode, the 3 dB attenuated in-phase RC(t) is input to the RF amplifier 132. Likewise, a 3 dB attenuated quadrature RC(f) is output from port 116C and input to the RF amplifier 122. Assuming the RF amplifiers 122 and 132 have a 30 dB gain, a 27 dB amplified in-phase RC(t) is output from amplifier 122 and input to port 128B of the second 90-degree hybrid 128, and a 27 dB amplified quadrature RC(t) is output from amplifier 132 and input to port 128A of the second 90-degree hybrid 128. The propagation through the second 90-degree hybrid 128 will now be described. With respect to the 27 dB in-phase signal input to port 128A, a 3 dB attenuated in-phase RC(t) will arrive at port 128C, and a 3 dB attenuated quadrature RC(t) will arrive at port 128D. With respect to the 27 dB quadrature RC(t) that is input to port 128B, a 3 dB attenuated in-phase RC(t) will arrive at port 128D, and a 3 dB attenuated quadrature RC(t) will arrive at port 128C. The total delay relative to RC(t) entering port 116A of the first 90-degree hybrid 116 for the quadrature of RC(t) propagating from port 128A to port 128D is therefore minus 180 degrees, while the total delay of the in-phase signal propagating from port 128B to port 128D is zero degrees. Therefore, omitting phase differences these signals cancel. On the other hand, referring to port 128C of the second hybrid coupler 128, the RC(t) it receives from port 128A has the same phase delay as the RC(t) it receives from port 128B. The signals therefore add, producing a 27 dB gain RC(t) that, in the FIG. 3 example 100, is input to port 106C of the first circulator 106 and then, according to the depicted characteristic of the circulator 116, out from port 106 A to the BST 102.

Figure 4:
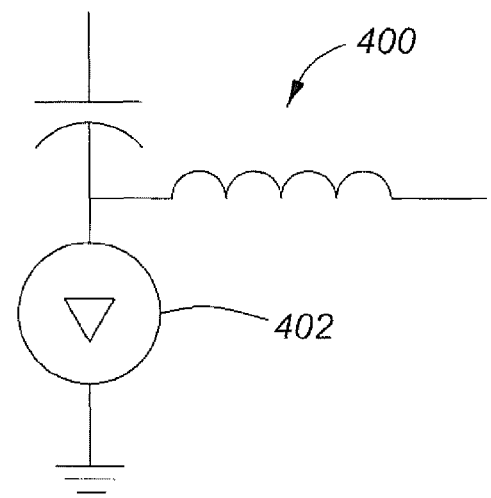
FIG. 4 depicts one illustrative example implementation of one switching impedance termination using a PIN Diode of one example hybrid bypass switch aspect of one or more embodiments.

FIG. 4 shows one example implementation 400 of the switchable grounding impedances 138, 140 connected to ports 136C and 136D of the 90-degree hybrid 136. Referring to FIG. 4, the example 400 comprises a PIN diode 402 fed by a bias generator (not shown) outputting a two voltage state signal (not shown in FIG. 4) such as, for example, 5 and −70 volts.

Figure 5:
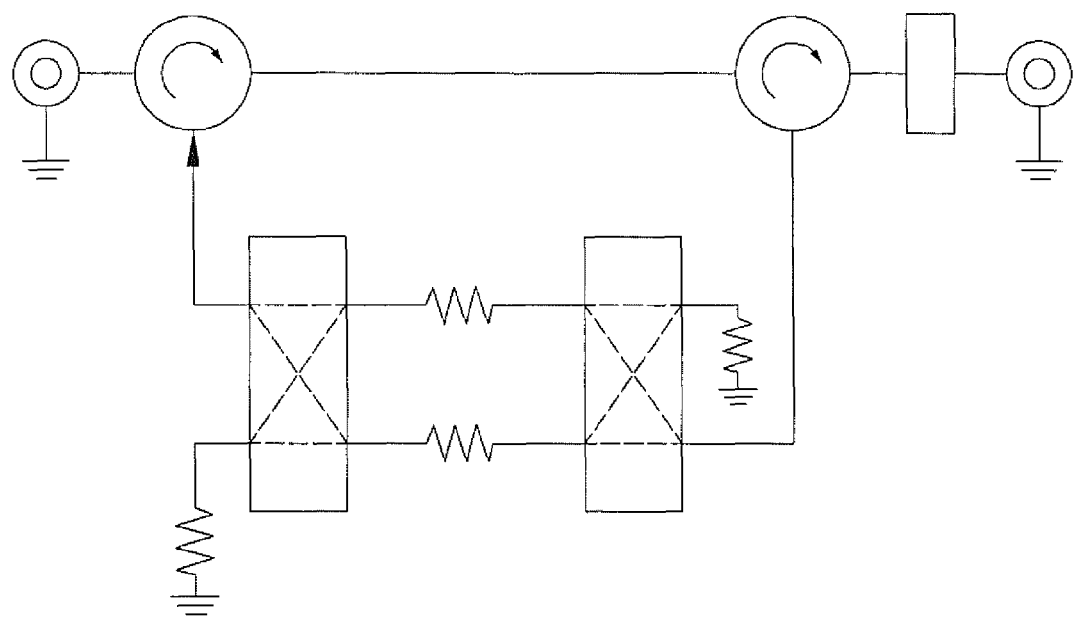
FIG. 5 illustrates an approximate equivalent circuit representing the FIG. 3 example in its normal operating mode, during transmission of signal.

FIG. 5 illustrates an approximate equivalent circuit representing the FIG. 3 example 100 in its normal operating mode, during transmission of signal into port 106A of circulator 106. Referring to FIGS. 3 and 5 together, the switchable impedance SPDT switches 118 and 120 are in their matched impedance state, and are each switched to connect their respective "C" inputs to their respective "B" outputs. Further, the switchable impedances 138, 140 connected to ports 136C and 136D of the 90-degree hybrid 136 provide proper matched impedance and, therefore ports 136A and 136B provide match impedance for ports 116A of the 90-degree hybrid 116 and port 128C of the 90-degree hybrid 128. All of the ports of the 90-degree hybrid 116 and 128 are therefore terminated by matched impedances. Accordingly, each of the 90-degree hybrids 116 and 128 operate in their normal mode, each functioning as a power splitter. As shown, any transmission signal entering port 116A of the 90-degree hybrid 116 is split into an attenuated in-phase and 90-degree delayed component output, respectively, from ports 116C and 116D of the 90-degree hybrid 116 and dissipated by the attenuators 126, 134. The attenuators 126 and 134 are readily specified and implemented by a person or ordinary skill in the art, based on this disclosure, such that any leakage or coupling energy of the transmitter signal is sufficiently attenuated by the devices 126, 134.

Figure 6:
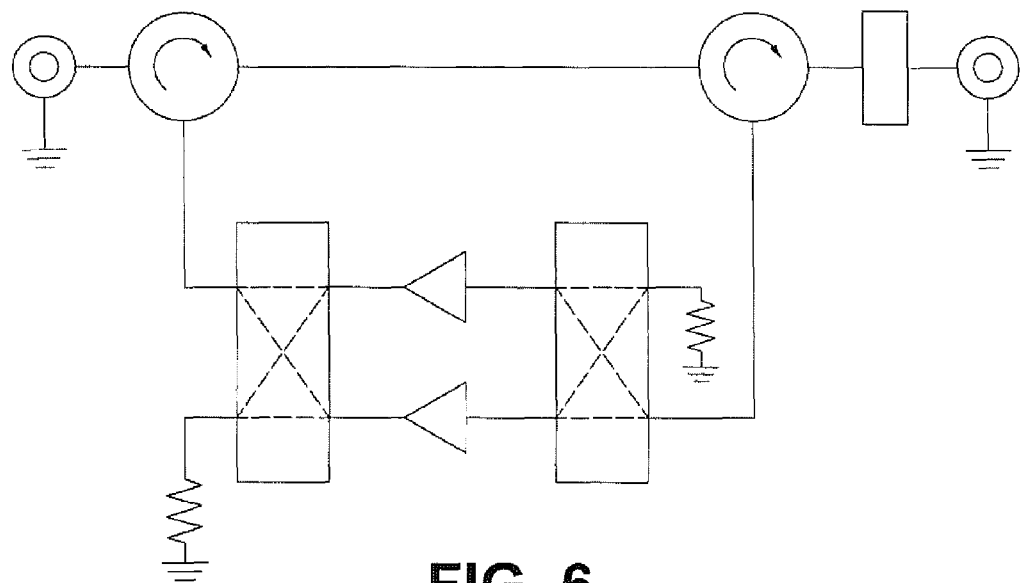
FIG. 6 illustrates an approximate equivalent circuit representing the FIG. 3 example in its normal operating mode, during receiving of signal from the antenna.

FIG. 6 illustrates an approximate equivalent circuit representing the FIG. 3 example 100 in its normal operating mode, during a receiving of signal from the antenna (not shown in FIG. 3). Comparing FIG. 6 to FIG. 5, it is seen that switchable impedance SPDT switches 118 and 120 connect their respective "C" inputs to their respective "A" outputs which, in turn, are connected to the inputs 122A and 132A or the RF amplifiers 122, 132. In a corresponding manner, SPDT switches 124 and 134 connect their respective "A" inputs, each receiving a corresponding one of the outputs of the RF amplifiers 122, 132, to the switches respective "C" output. Reception signal entering I/O port 116A of the 90-degree hybrid 116 is split into the above-described two signals, one being an in-phase signal exiting I/O port 116D, the other being a 90-degree delayed signal exiting port 116C. These signals are input, respectively, to the RF amplifiers 122 and 132, and each is amplified by, for example, 30 dB. Proceeding with the description in the direction of the example reception signal propagation, an amplified in-phase reception signal from the output 132B of the RF amplifier 132 passes through the switchable impedance SPDT switch 134 and into I/O port 128B of the 90-degree hybrid coupler 128. Similarly, an amplified 90-degree delayed reception signal output from the output 122B of the RF amplifier 122 passes through the switchable impedance SPDT switch 124 and into I/O port 128A of the 90-degree hybrid coupler 128.

With continuing reference to FIG. 3, as readily seen and understood by a person of ordinary skill in the art in view of this disclosure, the 90-degree hybrid coupler 128 splits the amplifier 90-degree delayed amplified reception signal entering its port 128A into two signals. Likewise, the 90-degree hybrid coupler 128 splits the amplifier 90-degree delayed amplified reception signal entering its port 128A into two signals. The signal arriving at port 128C from port 128A is the quadrature signal from port 128A and, since the signal entering port 128A is in-phase relative to the input at 116A, the total delay is minus 90-degrees. The signal arriving at port 128C from port 128B is the in-phase signal from port 128B but, since the signal entering port 128B is the quadrature signal relative to the input at 116A, the total delay is the same as the total delay of the signal arriving at port 128C from port 128A, namely minus 90-degrees. Therefore, the signal arriving at port 128C from port 128A adds to the signal arriving at port 128C from port 128B. In contrast, the signal arriving at port 128D from port 128A cancels, assuming ideal operation by the 90-degree hybrids 116 and 128, the signal arriving at port 128C from port 128B.

As can be seen from FIG. 3, the signal arriving at port 128D from port 128A is in-phase relative to port 128A, and the signal entering port 128A is in-phase relative to the signal entering port 116A. Thus, with respect to the signal entering port 128D from port 128A, the overall phase delay is zero. On the other hand, the arriving at port 128D from port 128B is the quadrature signal from port 128B and, since the signal entering port 128B is the quadrature signal relative to the input at 116A, the total delay is minus 180 degrees. Therefore, the signal arriving at port 128D from port 128A cancels the signal arriving at port 128D from port 128B.

As persons of ordinary skill in the art will understand from this disclosure, factors such as different path delays may result in phase difference between the two signals arriving at port 128C, as well as two signals arriving at port 128D. A distortion and attenuation may result. However, persons of ordinary skill in the art can, based on given system requirements, readily identify bounds for such factors, and applying conventional know-how to this disclosure, can readily select circuit topologies and components accordingly.

Figure 7:
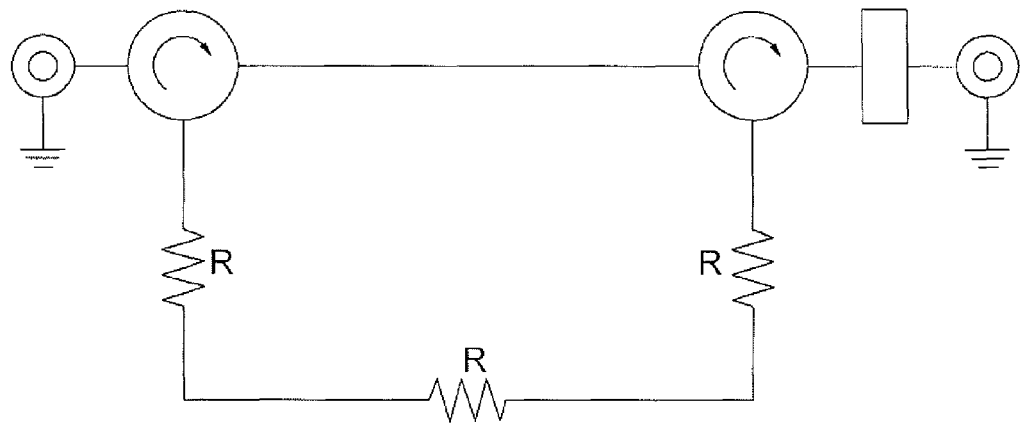
FIG. 7 illustrates an approximate equivalent circuit representing the FIG. 3 example in its bypass operating mode.

FIG. 7 illustrates an approximate equivalent circuit representing the FIG. 3 example 100 in its bypass operating mode.

Referring to FIGS. 6 and 7, it is assumed that the switchable impedance switches 118, 120, 124 and 134 are all in their mismatching impedance state such as, for example, would result from a power supply failure. Likewise, it is assumed the switchable impedance terminations 138 and 140 are in their mismatching state. The result is that I/O port 116B forms a direct path to I/O port 116, I/O port 128A forms a direct path to I/O port 128B. Similarly, I/O port 136A forms a direct path to I/O port 136B.

Figure 8:
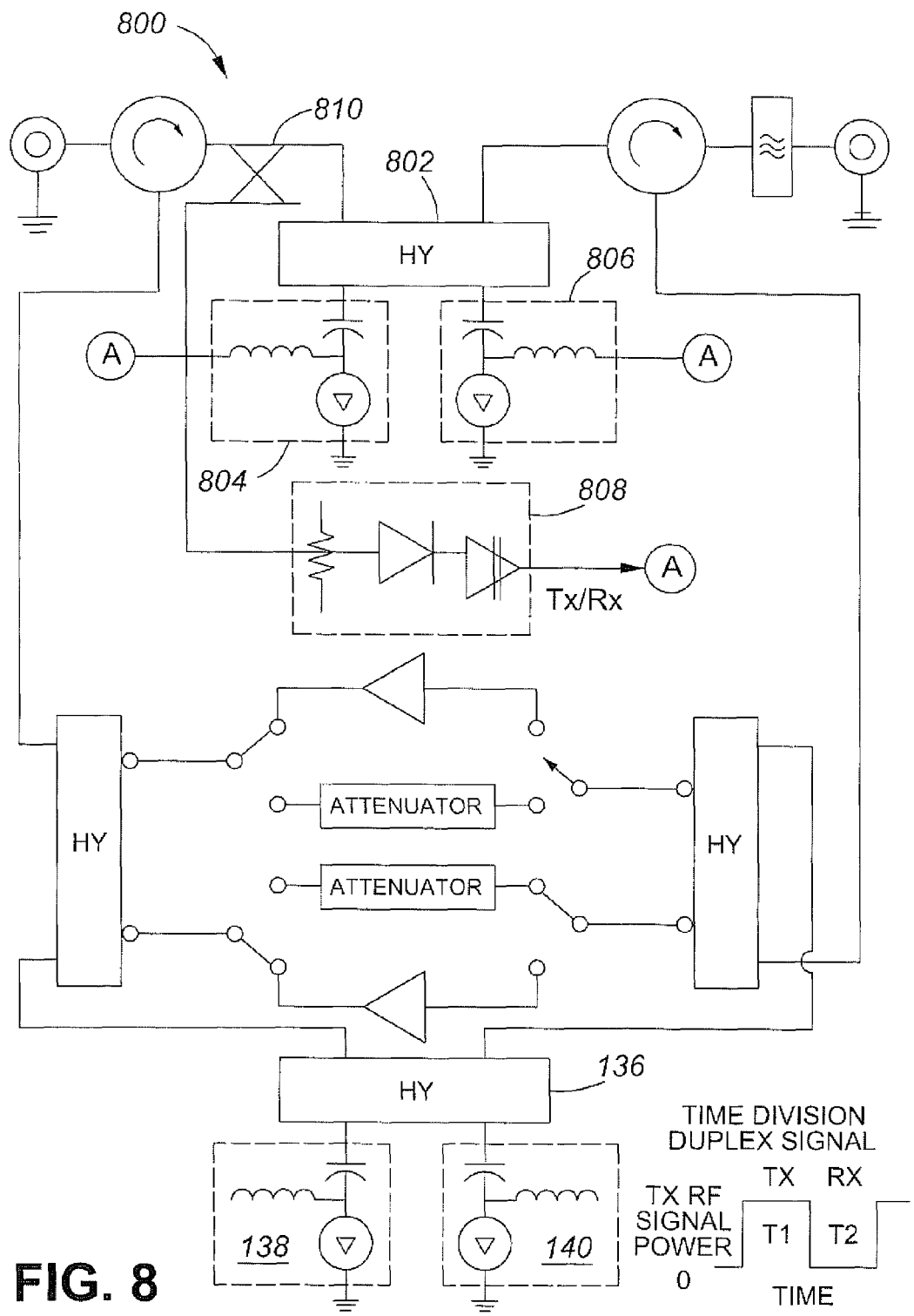
FIG. 8 shows one example 800, having embodiments as illustrated at FIG. 3 and further including a receiving interval transmission path isolation aspect that disables the forward transmission path labeled 108 in FIG. 3 during receiving intervals.

FIG. 8 shows one example 800, having embodiments as illustrated at FIG. 3 and further including a receiving-interval transmission path isolation aspect that disables the forward transmission path labeled 108 in FIG. 3 during receiving intervals. Referring to FIG. 8, in the example 800 the illustrative implementation of the receiving-interval transmission path isolation aspect is a 90-degree hybrid 802, fed at its I/O port 802A by transmission signal from I/O port 106B of the first circulator 106, having switchable impedances 804 and 806 terminating hybrid I/O ports 802C and 802D, and I/O port 802B of the 90-degree hybrid 80 feeding I/O port 110A of the second circulator 110 through transmission path 808. The 90-degree hybrid 802 may, for example, be structurally identical to a 90-degree hybrid implementing the hybrid coupler 136 and, likewise, the switchable impedances 804, 806 may be structurally identical to the switchable impedances 138, 140 terminating I/O ports 136C, 136D, respectively, of the coupler 136. As described above, and as shown by the PIN diode example 400 shown in FIG. 4, in the event of a given condition such as, for example, a power failure, the switchable impedances 138, 140 assume their mismatching impedance state. Therefore, in an example implementation of the FIG. 8 example 800 that uses the same or equivalent structure for the switchable impedances 804, 806 as for the impedances 138, 140, the same given event, namely a power failure, causes the impedances to 804, 806 to assume the mismatching impedance state. The result is that, with respect to transmission signal entering port 802A, the ports 802C and 802D will reflect the in-phase and quadrature signals arriving at these ports (i.e., the respective signals that these ports receive as a result of the signal entering port 802A) back into the ports 802C, 802D, and these reflected signals will sum at port 802B. The summed signal then propagates through path 808 to the I/O port 110A of the circulator 110. In other words, in the event of, for example, a power failure the 90-degree hybrid 802 acts as a straight through coupler between its ports 802A and 802C.

With continuing reference to FIG. 8, illustrative example operations of the receiving-interval transmission path isolation aspect will be described. Unless otherwise stated, described example operations assume a normal state, e.g., an acceptable power supply level. Referring to FIG. 8, a transmission interval TI may be defined as the interval during which transmission signal power is detected as output from port 106B of the circulator 106. In the FIG. 8 example, the detection is performed by a power detector 808. The power detector 808 may be the previously described power detector 107. Resulting from the detection the power detector 808 outputs the previously described transmit/receive signal TX/RX having an appropriate value, arbitrarily labeled as TR that, in accordance with the FIG. 8 arrangement, causes the switchable impedances 804, 806 to assume their mismatching state. Assuming the switchable impedance 804, 806 are PIN diodes as illustrated at FIG. 4, the TR value is determined by the voltage needed to reverse bias the PINs which may, for example, be minus 75 volts. As a result of the mismatching impedance of 90-degree hybrid 802 acts as a straight-through coupler between its ports 802A and 802C. Therefore, during the transmission interval TI, transmission signal enters I/O port 106A of the first circulator, exits the circulator port 106B, propagates into I/O port 802A and out of I/O port 802B of the 90-degree hybrid 802, then through path 808, into I/O port 110A of the second circulator 110 and, finally, from I/O port HOB of the second circulator 110 through the EPF 112 (if included) and into the antenna feed port 114. As readily seen, during intervals in which the power detector 808 does not detect transmission signal power, i.e., during receive intervals RI, the detector 808 generates a TX/RX signal having an appropriate value RR that causes the switchable impedances 804, 806 to assume their matching state. As described above, one illustrative matching state impedance is 50 ohms, at the signal frequency at which the system operates. Continuing with the assumption that the switchable impedances are PIN diodes as shown at FIG. 4, one illustrative example value RR is positive five volts. Upon receiving a five volt TX/RX, the switchable impedances 804, 806 assume their matching state and, as result any transmission signal energy entering the I/O port 802A exits I/O ports 802C, 802D as an in-phase and quadrature signal, respectively. Since the switchable impedances 804, 806 are in their matching impedance such signals are grounded.

As shown in the example 800, a directional coupler such as item 810 may be inserted in the path between the I/O port 106B of the circulator 106 and the I/O port 802A of the 90-degree hybrid. The directional coupler could also be inserted before the first circulator 106. The purpose and function of the directional coupler 810 is to prevent, or reduce to an acceptable level, energy reflected back from the I/O port 802A from travelling back to port 106B of the circulator 106. It will be understood that the directional coupler 810 may be used as well in the forward transmission path 108 of the FIG. 3 example 100.

The above-described embodiments and aspects provide various advantages, benefits and features that constitute significant advances over the prior art, in terms of, for example, scope of functions, performance, reliability and testability.

One among the various examples is provided by the hybrid coupler 136, in its depicted arrangement of connecting to the 90-degree hybrid coupler 128 and to the 90-degree hybrid coupler 116, the 90-degree hybrid coupler 136 itself terminated with controllable impedances 138 and 140. This novel arrangement and structure provides for the 90-degree hybrid coupler 136 to server two functions; one function being the proper termination impedance for the 90-degree hybrid couplers 128 and 116 when proper supply power is available (and hence the RF amplifiers 122, 132 function), and the other function being part of the bypass path occurring n the event of, for example power failure (by way of the path from 136A to 136B resulting from impedances 138 and 140 switching to their mismatched state).

Another among the various examples is provided by the transmit-interval RF amplifier isolation aspect, described in reference to FIGS. 3-8, that, by using the power detector 107 (or 808) generates the TX/RX control signal to switch the RF amplifiers 122, 132 in and out of the return path, without requiring external control signals.

Another among the various example advantages, benefits and features is provided by the receiving-interval transmitter isolation aspect, e.g., the isolation hybrid coupler 802 described in reference to FIG. 8 that, in the transmit mode (i.e., when the power detector 808 generates the TX/RX signal to set the impedances 804, 808 to their mismatch state) provides a low-loss forward path but, during the receiving interval (i.e., when the power detector 808 generates the TX/RX signal to set the impedances 804, 808 to their matching state), provides high isolation between the antenna feed port 114 and the BTS port 102. One particular contemplated advantage of this is attenuation of out-of-band reflections from the LNA in the RX mode from the band pass filter 112.

Another among the various example advantages, benefits and features is provided by the 1:2 and 2:1 SPDT features of the FET switches 118, 120, 124 and 134 that provide selecting a path through the RF amplifiers 122, 132 in the receiving mode and a path through the attenuators 126,130 in the transmit mode. As will be understood by a person of ordinary skill in the pertinent art upon reading this disclosure, embodiments combining the receiving-interval transmitter isolation aspect, e.g., the isolation hybrid coupler 802 and the 1:2 and 2:1 SPDT features of the FET switches 118, 120, 124 and 134 providing a selectable path through the RF amplifiers 122, 132 in the receiving mode, and through the attenuators 126,130 in the transmit mode, permit introduction of a calibration signal into the BTS port 102 in the receive mode only and read back through the RF amplifiers 122, 132. Prior art TDD systems using switches cannot be calibrated in this manner.

As will also be understood by persons skilled in the arts, upon reading this disclosure, this combination even further allows measurement of return loss in the transmit mode.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be affected while remaining within the spirit and scope of the invention. Accordingly, the foregoing disclosure, description, and figures are for illustrative purposes only and do not in any way limit the invention, which is defined only by the claims.

We hereby claim:

1. A circuit for connecting a transceiver input/output to an antenna, the circuit comprising:
   a transceiver port;
   an antenna port;
   a reception path disposed between the transceiver port and the antenna port;
   a first amplifier configured to amplify a signal on the reception path when the circuit is configured according to a normal operation mode;
   a first hybrid coupler configured to establish a bypass path around the first amplifier, wherein the first hybrid coupler is part of the bypass path, when the circuit is configured according to a bypass operation mode;
   a second hybrid coupler configured to establish the bypass path around the first amplifier when the circuit is configured according to the bypass operation mode, wherein the first hybrid coupler is disposed between the first amplifier and the transceiver port, and the second hybrid coupler is disposed between the first amplifier and the antenna port; and
   a third hybrid coupler configured to establish the bypass path around the first amplifier when the circuit is configured according to the bypass operation mode, wherein the third hybrid coupler is disposed between a port of the first hybrid coupler and a port of the second hybrid coupler.

2. The circuit of claim 1, further comprising:
   a transmission path disposed between the transceiver port and the antenna port.

3. The circuit of claim 2, further comprising:
   a power detector configured to detect transmitter power on the transmission path and configure the circuit according to the bypass operation mode when the power detector detects transmitter power on the transmission path.

4. The circuit of claim 1, further comprising:
   a second amplifier configured to amplify the signal on the reception path;
   a first switchable impedance disposed between a first port of the first hybrid coupler and the first amplifier; and
   a second switchable impedance disposed between a second port of the first hybrid coupler and the second amplifier, wherein, the circuit being configured according to the bypass operation mode comprises the first switchable impedance and the second switchable impedance being configured in a mismatched state, whereby a third port of the first hybrid coupler is directly connected to a fourth port of the first hybrid coupler.

5. The circuit of claim 1, further comprising:
a first switchable impedance connected to a first port of the first hybrid coupler; and
a second switchable impedance disposed connected to a second port of the first hybrid coupler, wherein, the circuit being configured according to the bypass operation mode comprises the first switchable impedance and the second switchable impedance being configured in a mismatched state, whereby a third port of the first hybrid coupler is directly connected to a fourth port of the first hybrid coupler.

6. The circuit of claim 5, wherein the circuit being configured according to the normal operation mode comprises the first switchable impedance and the second switchable impedance being configured in a matching state, whereby the third port of the first hybrid coupler splits an input signal between the first port and the second port.

7. The circuit of claim 1, further comprising:
a pair of switchable grounding impedances disposed between the third hybrid coupler and a ground.

8. The circuit of claim 1, further comprising:
a first switchable impedance disposed between the first amplifier and the transceiver port;
a second switchable impedance disposed between the first amplifier and the antenna port; and
an attenuator disposed between the first switchable impedance and the second switchable impedance, wherein the first switchable impedance and the second switchable impedance are configured to selectively direct the signal through either the amplifier or the attenuator.

9. A circuit for connecting a transceiver input/output to an antenna, the circuit comprising:
a transceiver port;
an antenna port;
a transmission path disposed between the transceiver port and the antenna port;
a reception path disposed between the transceiver port and the antenna port;
a power detector configured to detect transmitter power on the transmission path;
a first attenuator configured to attenuate a signal on the reception path based on the power detector detecting the transmitter power on the transmission path;
a first amplifier configured to amplify the signal on the reception path based on the power detector not detecting the transmitter power on the transmission path; and
a first hybrid coupler configured to establish a bypass path around the first amplifier and the first attenuator, wherein the first hybrid coupler is part of the bypass path;
a second hybrid coupler configured to establish the bypass path around the first amplifier when the circuit is configured according to a bypass operation mode, wherein the first hybrid coupler is disposed between the first amplifier and the transceiver port, and the second hybrid coupler is disposed between the first amplifier and the antenna port; and
a third hybrid coupler configured to establish the bypass path around the first amplifier when the circuit is configured according to the bypass operation mode, wherein the third hybrid coupler is disposed between a port of the first hybrid coupler and a port of the second hybrid coupler.

10. The circuit of claim 9, further comprising:
a first switchable impedance disposed between a first port of the hybrid coupler, the first amplifier, and the first attenuator, wherein the first switchable impedance is controllable by the power detector to determine whether the first attenuator attenuates the signal or the first amplifier amplifies the signal.

11. The circuit of claim 10, further comprising:
a second amplifier;
a second attenuator; and
a second switchable impedance disposed between a second port of the hybrid coupler, the second amplifier, and the second attenuator, wherein the hybrid coupler being configured to establish the bypass path comprises the first switchable impedance and the second switchable impedance occupying a mismatched state, whereby a third port of the hybrid coupler and a fourth port of the hybrid coupler are directly connected to one another.

12. The circuit of claim 9, further comprising:
a bandpass filter disposed between the antenna port and the first amplifier.

13. The circuit of claim 9, further comprising:
a circulator disposed between the transmission path, the reception path, and at least one of: the transceiver port and the antenna port.

14. The circuit of claim 9, wherein the hybrid coupler is configured to direct the signal over the bypass path in response to a power supply failure.

15. A circuit for connecting a transceiver input/output to an antenna, the circuit comprising:
a transceiver port;
an antenna port;
a transmission path disposed between the transceiver port and the antenna port;
a reception path disposed between the transceiver port and the antenna port;
a power detector configured to detect transmitter power on the transmission path;
a first attenuator configured to attenuate a signal on the reception path based on the power detector detecting the transmitter power on the transmission path;
a first amplifier configured to amplify the signal on the reception path based on the power detector not detecting the transmitter power on the transmission path; and
a first switchable impedance connected to the first amplifier and the first attenuator, wherein the first switchable impedance is controllable to direct the signal on the reception path to either the first amplifier or the first attenuator.

16. The circuit of claim 15, wherein the power detector is configured to output a transmit/receive signal that controls the first switchable impedance.

17. The circuit of claim 15, further comprising:
a second amplifier;
a second attenuator; and
a second switchable impedance connected to the second amplifier and the second attenuator, wherein the second switchable impedance is controllable to direct the signal on the reception path to either the first amplifier or the first attenuator.

18. The circuit of claim 17, further comprising:
a third switchable impedance connected to the first amplifier and the first attenuator; and
a fourth switchable impedance connected to the second amplifier and the second attenuator.

19. A circuit for connecting a transceiver input/output to an antenna, the circuit comprising:
a transceiver port;
an antenna port;
a reception path disposed between the transceiver port and the antenna port;
a first amplifier configured to amplify a signal on the reception path when the circuit is configured according to a normal operation mode;
a first hybrid coupler configured to establish a bypass path around the first amplifier, wherein the first hybrid coupler is part of the bypass path, when the circuit is configured according to a bypass operation mode;
a first switchable impedance connected to a first port of the first hybrid coupler; and
a second switchable impedance disposed connected to a second port of the first hybrid coupler, wherein the circuit being configured according to the bypass operation mode comprises the first switchable impedance and the second switchable impedance being configured in a mismatched state, whereby a third port of the first hybrid coupler is directly connected to a fourth port of the first hybrid coupler.

20. The circuit of claim 19, further comprising:
a second amplifier configured to amplify the signal on the reception path, wherein the first switchable impedance is disposed between a first port of the first hybrid coupler and the first amplifier, the second switchable impedance is disposed between a second port of the first hybrid coupler and the second amplifier, and the circuit being configured according to the bypass operation mode comprises the first switchable impedance and the second switchable impedance being configured in a mismatched state, whereby a third port of the first hybrid coupler is directly connected to a fourth port of the first hybrid coupler.

21. The circuit of claim 19, wherein the circuit being configured according to the normal operation mode comprises the first switchable impedance and the second switchable impedance being configured in a matching state, whereby the third port of the first hybrid coupler splits an input signal between the first port and the second port.

22. The circuit of claim 19, further comprising:
an attenuator disposed between the first switchable impedance and the second switchable impedance, wherein the first switchable impedance and the second switchable impedance are configured to selectively direct the signal through either the amplifier or the attenuator.

23. A circuit for connecting a transceiver input/output to an antenna, the circuit comprising:
a transceiver port;
an antenna port;
a transmission path disposed between the transceiver port and the antenna port;
a reception path disposed between the transceiver port and the antenna port;
a power detector configured to detect transmitter power on the transmission path;
a first attenuator configured to attenuate a signal on the reception path based on the power detector detecting the transmitter power on the transmission path;
a first amplifier configured to amplify the signal on the reception path based on the power detector not detecting the transmitter power on the transmission path;
a hybrid coupler configured to establish a bypass path around the first amplifier and the first attenuator, wherein the hybrid coupler is part of the bypass path; and
a first switchable impedance disposed between a first port of the hybrid coupler, the first amplifier, and the first attenuator, wherein the first switchable impedance is controllable by the power detector to determine whether the first attenuator attenuates the signal or the first amplifier amplifies the signal.

* * * * *